United States Patent [19]

Sato et al.

[11] Patent Number: 4,630,086
[45] Date of Patent: Dec. 16, 1986

[54] NONVOLATILE MNOS MEMORY

[75] Inventors: Nobuyuki Sato, Tokorozawa; Kyotake Uchiumi; Shinji Nabetani, both of Tokyo; Ken Uchida, Higashiyamato, all of Japan

[73] Assignees: Hitachi, Ltd.; Hitachi Microcomputer Engineering Ltd., Japan

[21] Appl. No.: 535,233

[22] Filed: Sep. 23, 1983

[30] Foreign Application Priority Data

Sep. 24, 1982 [JP] Japan .................. 57-164910

[51] Int. Cl.$^4$ .................. H01L 29/78; H01L 27/02; H01L 29/34
[52] U.S. Cl. .................. 357/23.5; 357/23.9; 357/23.11; 357/41; 357/48; 357/54; 357/59; 365/184
[58] Field of Search .................. 357/23.5, 41, 54

[56] References Cited

U.S. PATENT DOCUMENTS

| | | | |
|---|---|---|---|
| 3,856,587 | 12/1974 | Yamazaki et al. | 357/23.5 |
| 3,878,549 | 4/1975 | Yamazaki et al. | 357/23.5 |
| 4,115,914 | 9/1978 | Harari | 357/23.5 |
| 4,375,087 | 2/1983 | Wanlass | 357/23.5 |

Primary Examiner—Gene M. Munson
Attorney, Agent, or Firm—Antonelli, Terry & Wands

[57] ABSTRACT

A nonvolatile memory which has both the merits of a floating gate type EEPROM and an MNOS type EEPROM and which can be written into and erased with low voltages is disclosed. Each memory element in the nonvolatile memory has a floating gate, a control gate, a gate insulator film between a semiconductor body and the floating gate, and an inter-layer insulator film between the control gate and the floating gate. The gate insulator film is made up of a very thin $SiO_2$ film and a thin $Si_3N_4$ film formed thereon. The charge centroid of charges injected for storing data lies within the floating gate, not within the $Si_3N_4$ film.

14 Claims, 9 Drawing Figures

NONVOLATILE MNOS MEMORY

BACKGROUND OF THE INVENTION

The present invention relates to a nonvolatile memory which has a density of integration and a low operating voltage.

In general, nonvolatile memories used as EEPROMs (Electrically Erasable and Programmable ROMs) or EAROMs (Electrically Alterable ROMs) are constructed of MISFETs (Metal-Insulator-Semiconductor Field Effect Transistors) which are broadly classified into two types; the FLOTOX (Floating Tunnel Oxide) type belonging to the floating gate type, and the MNOS (Metal-Nitride-Oxide-Semiconductor) type. The former has a control gate electrode for control, and a floating gate electrode for storing a charge. The charge carriers to be stored in the floating gate are injected thereinto by passing them through a thin oxide film (e.g. 2 nm–20 nm on a drain region owing to the modified Fowler-Nordheim tunneling (MFN tunneling) or the direct tunneling (hereinbelow, simply termed "tunneling"). On the other hand, the latter has its gate insulator film formed of a double-layer structure consisting of a silicon dioxide film ($SiO_2$ film) and a silicon nitride film ($Si_3N_4$ film) deposited thereon. Charge carriers are tunneled through the $SiO_2$ film, thereby to be injected and stored in those traps within the $Si_3N_4$ film which are formed near the boundary of the two insulator films.

The respective semiconductor devices, however, have certain problems, to be discussed below, which serve to hamper enhanced densities of integration and lowered operating voltages of the memories.

The FLOTOX is particularly advantageous in data retention. In order to ensure the retention of the charges, however, a thick inter-layer insulator film of about 1000 Å, similar to that used in a conventional EPROM (Erasable and Programmable ROM), needs to be interposed between the floating gate and the control gate. The thickness is required for preventing the stored charge of the floating gate from leaking to the control gate. It is therefore impossible to simply apply scaling-down procedures for the purpose of enhancing the density of integration. Besides, in the FLOTOX, in constructing memory cells, the registration between the drain regions previously formed and the floating gates becomes a serious problem. Since an allowance for alignment is required, the fine processing of a pattern attendant upon an enhanced density of integration becomes very difficult.

With the MNOS, the alignment between gates and drain regions is not a problem. In addition, the latter is advantageous in endurance. However, scaling-down the device for the purpose of enhancing the density of integration cannot be simply performed on the MNOS, either. When the $Si_3N_4$ film constituting the gate insulator film becomes thinner than a certain value (generally about 200 Å) by reason of the scaling-down procedure, there arises the phenomenon that the charge carriers are emitted to a gate electrode. Therefore, retention becomes a serious problem. In this manner, the reduction of the thickness of the $Si_3N_4$ film, namely, the scaling-down is limited, which forms obstacles to enhancing the density of integration and lowering the operating voltage.

SUMMARY OF THE INVENTION

An object of the present invention is to provide a nonvolatile memory which can attain a higher density of integration and lower writing and erasing voltages while holding the retention of charges favorable.

According to the present invention, an element for storing charge comprises a floating gate which is a first electrode formed over a semiconductor body in order to store the charge, a control gate which is a second electrode formed over the first electrode, a gate insulator film which is interposed between the semiconductor body and the first electrode, and an inter-layer insulator film which is interposed between the first electrode and the second electrode. At least the gate insulator film or tunnel region consists of two, upper and lower layers of insulator films whose dielectric constants differ from each other. The charge carriers for storing data are retained in such a way that the floating gate is charged. The centroid of the charge lies within the first electrode. Therefore, the upper-layer insulator film can be thinned.

As a preferable example, the lower layer of the gate insulator film is an $SiO_2$ film, while the upper layer of the gate insulator film is an $Si_3N_4$ film. The thickness of the upper-layer gate insulator film is set to be at least 40 Å and at most 100 Å. Polycrystalline silicon is used as the material of the floating gate as well as the control gate.

The above-mentioned and other objects of the present invention and the advantages thereof will be understood from the following description taken in conjunction with the drawings.

BRIEF DESCRIPTION OF THE DRAWINGS

FIGS. 1A and 1B are diagrams for explaining a charge centroid in an MNOS type FET, in which FIG. 1A is a graph of the characteristic, while FIG. 1B is a model-like sectional view of the MNOS type FET;

FIG. 2 is a sectional view showing the structure of a first FET according to the present invention, while

DESCRIPTION OF THE PREFERRED EMBODIMENTS

Figure 1A:
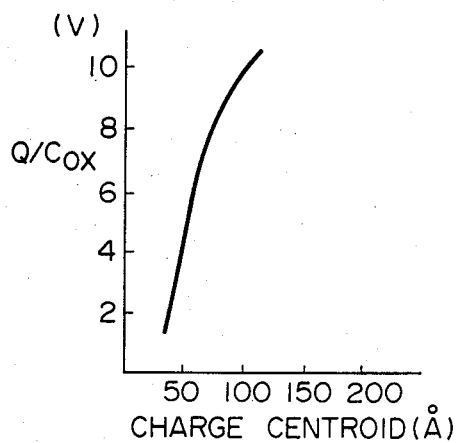
Figure 1B:
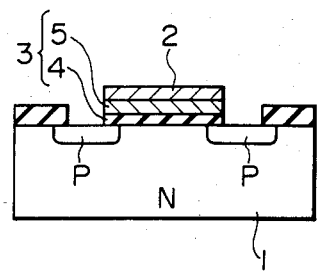

FIG. 1A illustrates the relationship between the charge centroid and the quantity of charge Q injected into traps within an $Si_3N_4$ film 5 in a FET of an MNOS structure shown in FIG. 1B, the result having been obtained on an experimental basis by the inventors. Referring to FIG. 1B, in the model used to obtain the test results, a gate insulator film 3 underlying a gate electrode 2 consisted of a silicon dioxide film ($SiO_2$ film)

4 being 23 Å thick and a silicon nitride film (Si$_3$N$_4$ film) 5 being 520 Å thick.

Briefly stated, the charge centroid is found in the following way. It is assumed that all the injection charge Q exists in a plane which is parallel to the boundary between the SiO$_2$ film 4 and the Si$_3$N$_4$ film 5 and which is spaced a certain distance d from the boundary. Meanwhile, the capacitance C of a MIS capacitor is evaluated from the injection charge Q and a potential V generated in the MIS capacitor of the gate electrode portion by the charge (C=Q/V). The aforementioned distance d is evaluated from the capacitance C, the area S of the gate electrode portion, and the dielectric constant $\epsilon$ which is substantially stipulated by the two insulator films (d=$\epsilon$·S/C). This distance d is the charge centroid.

In FIG. 1A, the axis of abscissas represents the distance d (in Å) which is taken toward the gate 2 (upwards) from the boundary between the SiO$_2$ film 4 being the lower-layer gate insulator film and the Si$_3$N$_4$ film 5 being the upper-layer gate insulator film. On the other hand, the axis of ordinates represents the value of the injection charge quantity Q which is converted into the voltage V. This voltage value may be considered to be a value at which the charge injection quantity Q can vary the threshold voltage of the FET having the MNOS structure shown in FIG. 1B.

The experiment conducted by the inventors has revealed the following. As illustrated in FIG. 1A, the charge centroids formed by the trapped charge carriers are distributed in a region between about 40 Å to about 110 Å from the boundary of the SiO$_2$ film 4 and the Si$_3$N$_4$ film 5. In particular, the charge centroids often exist in the part of the Si$_3$N$_4$ film spaced about 100 Å from the boundary, and more injection charge carriers are trapped here. The charge centroids are scarcely existent in a region within 40 Å or a region distant more than 100 Å from the boundary.

Figure 2:
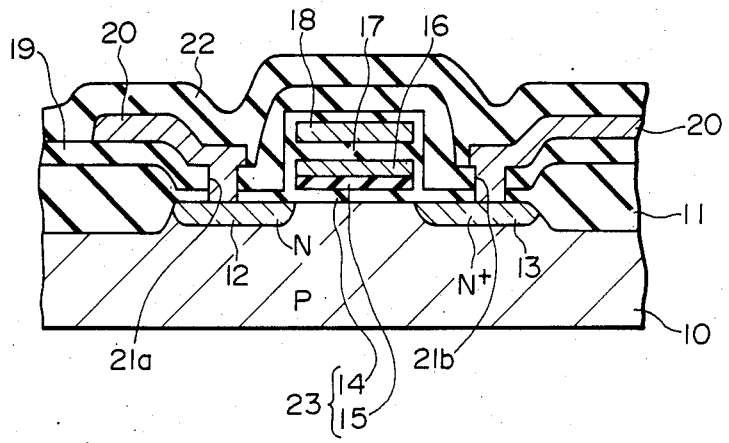

FIG. 2 shows a first embodiment of the FET of the present invention constructed on the basis of the above experiment so that a charge centroid may exist within a floating gate disposed on top of the gate electrode other than in the Si$_3$N$_4$ film. In the figure, numeral 10 designates a P-type semiconductor region. This region is constructed of a P-type silicon semiconductor substrate as a semiconductor body. The P-type substrate 10 is formed with a field oxide film 11 by thermal oxidation of the surface thereof, to define regions for forming elements. In each region, N$^+$-type regions 12 and 13 to construct source and drain regions are formed. An SiO$_2$ film 14 which is about 20 Å thick is formed on the surface of the element forming region by thermal oxidation of the substrate. The SiO$_2$ film 14 may have a thickness through which charge carriers can be tunneled, and which can assume a value of 15 Å-50 Å. In order to raise the efficiency of injection, a thinner film is better. In order to form a film of good quality at a high available yield percentage, a value of about 20 Å is preferable. An Si$_3$N$_4$ film 15 which is about 60 Å thick is formed in the lower part of a gate electrode portion by CVD (Chemical Vapor Deposition) or the like. The Si$_3$N$_4$ film 15 should be of such a thickness that the charge centroid can exist within a floating gate placed over it. While a value of 40 Å-110 Å can be taken, a value of approximately 50 Å-110 Å is more reliable. A thinner film is more preferable for minimizing the thickness of the gate insulator film.

The floating gate 16, which is a first electrode made of polycrystalline silicon about 20 Å-100 Å thick, is formed on the Si$_3$N$_4$ film 15, to thereby form a structure similar to the so-called MNOS structure. The floating gate 16 should favorably be thin. With the thin floating gate, it is difficult for the charge carriers to move within this gate. In a case where the gate insulator film has pinholes, this measure can reduce the amount of charge which will leak therethrough, resulting in improved data retention.

On the floating gate 16, an SiO$_2$ film 17 as an interlayer insulator film is formed to a comparatively great thickness of about 1000 Å. A control gate 18, which is a second electrode made of polycrystalline silicon, is formed on the SiO$_2$ film 17. In the figure, numeral 19 indicates a PSG (phosphosilicate glass) film, and numeral 20 indicates Al wiring which is electrically connected to the N$^+$-type regions 12 and 13 through contact holes 21a and 21b. The N$^+$-type regions 12, 13 are formed in self-alignment with the gate electrode by ion implantation or the like after the parts up to the control gate 18 have been finished up (unlike a conventional FLOTOX wherein the drain is formed before the gates so self-alignment is not possible). Shown at numeral 22 is a final passivation film, e.g., an SiO$_2$ film, formed by CVD.

The FET of the present embodiment is such that the complete gate insulator film or tunnel region 23 disposed under the floating gate 16 is made up of a double layer structure consisting of the SiO$_2$ film 14 of the lower-layer insulator film and the Si$_3$N$_4$ film 15 of the upper-layer insulator film whose dielectric constants differ from each other. Moreover, the thickness of the Si$_3$N$_4$ film of the upper layer is about 60 Å, which is smaller than the distance of the charge centroid. The injection charge quantity is set in relation to the Si$_3$N$_4$ film 15 in order that the charge centroid may lie within the floating gate. In addition, the thickness of the whole gate insulator film 23 with the upper and lower layers combined is very thin, for example, 80 Å in the present example.

When, in the FET shown in FIG. 2, a positive voltage is applied to the control gate 18 and the P-type substrate 10 is connected to the ground potential GND, electrons tunnel through the SiO$_2$ film 14 from the P-type substrate side, and the floating gate is charged. At this time, either one of the N$^+$-type regions 12, 13 is connected to the ground potential GND, and the other is held in the floating state. The injection of the electrons is based on the same action as that of the foregoing MNOS structure. Thus, the embodiment is advantageous in endurance because the gate insulator film degrades less than in the conventional floating-gate type EEPROM. Since, in the present example, the Si$_3$N$_4$ film 15 is made appropriately 60 Å thick, the center of the traps of the charge carriers (that part corresponding to the charge centroid which traps the greatest amount of charge) lies within the thickness of the floating gate 16, so that the charge carriers are stored in the floating gate 16. The charged region is the same as in the prior art floating gate type. Accordingly, the leakage of the charge from the Si$_3$N$_4$ film to the gate electrode is slight, and the retention is favorable, as in the conventional MNOS type EEPROM. Even when the thickness of the gate insulator film 23 decreases with scaling-down, no problem occurs as to the retention.

Trapping the charge can be done in the same manner as in the MNOS structure. Owing to the extreme thinness of the SiO₂ film 14 and Si₃N₄ film 15 and the fact that the dielectric constant of Si₃N₄ is higher than that of SiO₂, the voltage which is applied to the control gate 18 at the injection can be lowered when compared with a conventional FLOTOX device without spoiling the injection efficiency. According to the inventor's experiment, with the present embodiment, the tunneling of charge carriers sufficient for storing data was possible at about 10 V. Also, in forming the N⁺-type regions 12, 13, the floating gate 16, etc., the problem of alignment between the N⁺-type regions and the floating gate is not posed because of the self-alignment resulting from the fact that regions 12 and 13 are not formed until after the floating gate 16 and the control gate 18 is formed. This facilitates fining the pattern, namely, enhancing the density of integration, in cooperation with the scaling-down stated before. Further, the double layer film 23 provides a tunnel region which is much harder to destroy than in the case of a conventional FLOTOX.

In order to write data into the floating gate 16, in other words, to inject charge carriers thereinto, a positive voltage may be applied to the control gate 18, with the P-type substrate 10 connected to the ground potential GND. Conversely, in order to erase data written in the floating gate 16, in other words, to emit trapped charge carriers, the control gate 18 may be connected to the ground potential GND, with a positive voltage applied to the P-type substrate 10. Thus, the charge carriers are emitted to the P-type substrate 10. At this time, the potential of the N⁺-type regions 12, 13 may be any, and it is rendered equal to that of the P-type substrate 10 by way of example.

Figure 3:
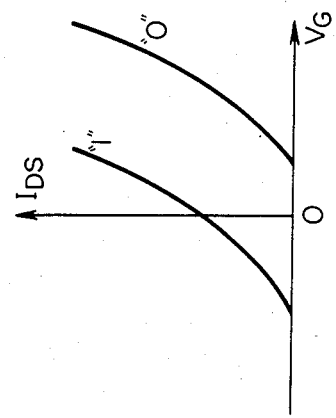
FIG. 3 is a graph illustrating the relationship between the gate voltage $V_G$ and drainsource current $I_{DS}$ of the FET shown in FIG. 2.

Written data is read out as follows. The current—voltage characteristics of the FET shown in FIG. 2 are set as indicated by "1" and "0" in FIG. 3 when the charge carriers are not trapped in the floating gate 16 and when they are trapped therein, respectively. The FET shown in FIG. 2 is set at the depletion mode having a threshold voltage of, e.g., $-3$ V or so beforehand, whereupon it is put into the enhancement mode when the threshold voltage is raised to, e.g., $+3$ V or so by the writing of the data, namely, the trapping of the charge carriers. In FIG. 3, the axis of abscissas $V_G$ represents the voltage which is applied to the control gate 18, while the axis of ordinates $I_{DS}$ represents the current which flows between the source region and the drain region, that is, between the N⁺-type regions 12 and 13. By utilizing such a difference of the threshold voltages, the potential of the control gate 18 is made, e.g., 0 V, whereby the data can be read out. Thus, the number of times reading can occur is increased. It is possible to know the two statuses in which the FET having the potential of the control gate set at 0 V is conductive (state of "1") and is nonconductive (state of "0"). The FET can accordingly be exploited as a nonvolatile memory element having one bit of data.

Figure 4:
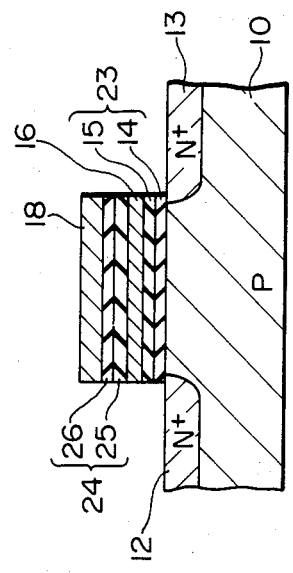
FIG. 4 is a sectional view showing the structure of the essential portions of a FET according to a second embodiment of the present invention.

FIG. 4 shows a second example of the FET according to the present invention, and particularly illustrates only the structure of a gate portion. The other parts not shown are the same as in FIG. 2. In the present embodiment, it is the same as in the preceding embodiment that the gate insulator film 23 held between the floating gate 16 and the semiconductor substrate 10 is constructed as a double-layer structure out of the SiO₂ film 14 as the lower-layer insulator film and the Si₃N₄ film 15 as the upper-layer insulator film. However, in addition to this, in FIG. 4, an inter-layer insulator film 24 lying between the floating gate 16 and the control gate 18 is constructed as a double-layer structure. The inter-layer insulator film 24 is composed of a lower-layer Si₃N₄ film 25, and an upper-layer SiO₂ film 26 formed by the thermal oxidation of the surface of the former. The films 25 and 26 are 60 Å and 20 Å thick, respectively. These films should preferably be thin. The Si₃N₄ film 25 can assume a value between 40 Å to 110 Å, and the SiO₂ film 26 a value between 15 Å to 50 Å. For reasons to be stated below, however, the thicknesses of the films 25 and 26 should desirably be respectively equal to the Si₃N₄ film 15 and the SiO₂ film 14 which constitute the gate insulator film 23.

When the inter-layer insulator film 24 is thus constructed, the whole thickness thereof can be rendered smaller than the thickness of the inter-layer insulator film constructed of the SiO₂ film 17 alone as shown in FIG. 2. Further, in spite of the thin inter-layer insulator film as the whole, the emission of charges from the floating gate 16 to the side of the control gate 18 can be effectively prevented. Thus, the data retention is improved to an even greater extent. This is based on the fact that charges having leaked from the floating gate 16 are captured by the Si₃N₄ film 25 which is prone to form the trap center, and that the leakage of charges from this Si₃N₄ film to the control gate 18 is prevented by the SiO₂ film 26. Although the SiO₂ film 26 is as thin as 20 Å, it is sufficient for preventing the charge leakage from the Si₃N₄ film 25. This structure is thus very effective for thinning the gate portion, and becomes more advantageous in the fine processing.

Since, in this structure, the two insulator films 23 and 24 underlying and overlying the floating gate 16 have approximately equal thicknesses, an electric field intensity in the floating gate 16 becomes about $\frac{1}{2}$ of a voltage applied to the control gate 18. Therefore, the efficiency of the tunneling of charge carriers can be enhanced. Thus, when the FET is used as a memory element, the writing voltage can be reduced. For example, when a voltage of 5 V is applied to the control gate 18, a potential which appears in the floating gate 16 becomes 2.5 V. In this case, a charge sufficient for raising the threshold voltage on the order of several volts can be injected, so that the FET can be satisfactorily used as the memory element. Of course, the emission of charge carriers can be similarly effected with a low voltage. The manners of applying voltages to the respective regions of the FET in the writing and erasing modes are the same as in the example of the first FET.

Figure 5:
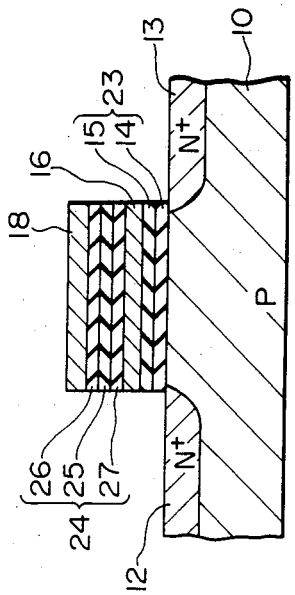
FIG. 5 is a sectional view showing the structure of the essential portions of a FET according to a third embodiment of the present invention.

FIG. 5 shows a third example of an FET according to the present invention. This example is such that, between the Si₃N₄ film 25 of the inter-layer insulator film 24 and the floating gate 16 in the FET of FIG. 4, an SiO₂ film 27 exists which is formed to a thickness of 20 Å by the thermal oxidation of the floating gate 16. Other than this, FIG. 5 is substantially identical to FIG. 4. As a result, the inter-layer insulator film 24 has a triple-layer structure composed of the upper, middle and lower layers 26, 25 and 27 which are an SiO₂ film, Si₃N₄ film and SiO₂ film, respectively. Owing to the extra SiO₂ film 27, it is possible to enhance the effect of preventing the leakage of charge from the floating gate 16 to the Si₃N₄ film 15.

With the second or third embodiments of an FET, writing and erasure at 5 V are permitted by optimizing the thicknesses of the Si₃N₄ films 15 and 25.

In the respective embodiments described above, the Si₃N₄ films 15, 25 may well be replaced with Al₂O₃ films or hydroxynitride films. For the control gate 18 and the floating gate 16, films made of molybdenum (Mo), tungsten (W), platinum (Pt), or the like may well be used instead of polycrystalline silicon films. Particularly for the floating gate 16, a film made of W, Pt or the like may well be used. An Al film may well be used for the control gate 18.

Figure 6:
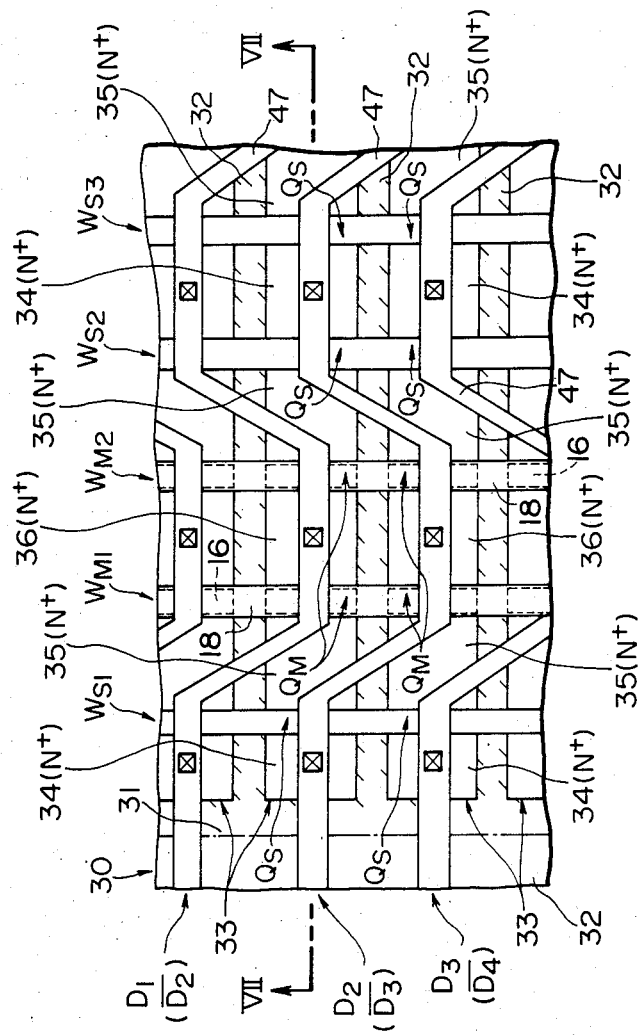
FIG. 6 is a plan view of an embodiment of a nonvolatile memory according to the present invention.
Figure 7:
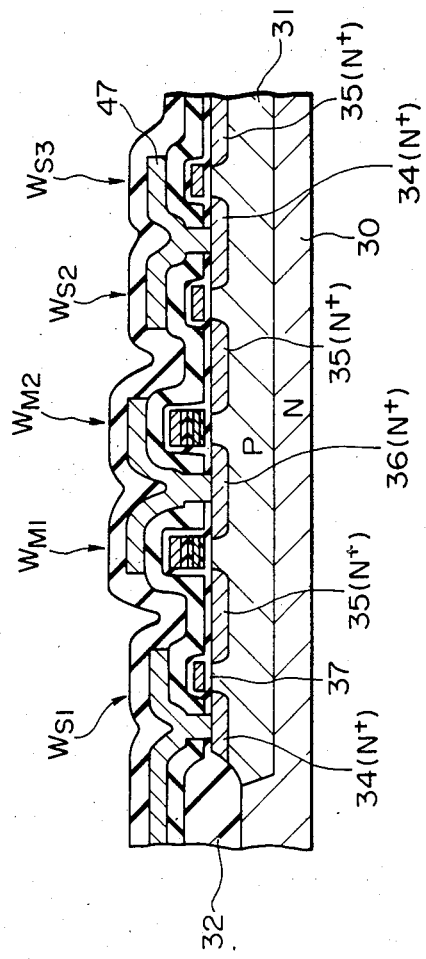
FIG. 7 is a sectional view taken along line VII—VII in the nonvolatile memory of FIG. 6.
Figure 8:
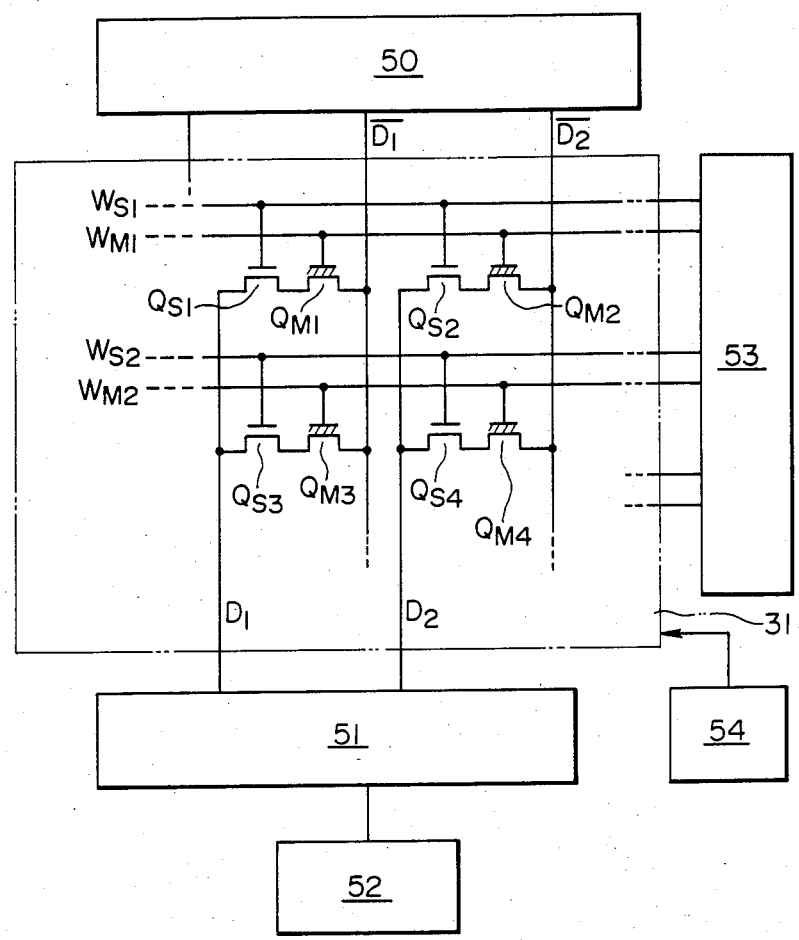
FIG. 8 is a memory circuit diagram of the nonvolatile memory of FIG. 6.

FIGS. 6 to 8 show an embodiment in which a nonvolatile memory is constructed by employing the FETs of the present invention as memory elements. FIGS. 6 and 7 are plan and sectional views of the embodiment, respectively, and FIG. 8 is a memory circuit diagram. As shown in FIGS. 6 and 7, a P-type well 31 indicated by a dot-and-dash line, as a semiconductor region for forming memory cells, is formed in an N-type silicon semiconductor substrate 30 as a semiconductor body. A plurality of elongated regions 33 for forming the elements, the regions being isolated by a field oxide film 32, are formed in the major surface of the silicon substrate. In each element forming region 33, N+-type regions 34, 35 and 36 are formed at predetermined intervals in the lengthwise direction of the element forming region 33, in self-alignment with word lines $W_{S1}, \ldots, W_{M1}, \ldots$. The adjacent N+-type regions 34 and 35 with the word lines $W_{S1}, \ldots$ sandwiched therebetween serve as the source or drain regions of MOSFETs $Q_{S1}, Q_{S2}, \ldots$ which are switching elements. The adjacent N+-type regions 35 and 36 with the word lines $W_{M1}, \ldots$ sandwiched therebetween serve as the source or drain regions of FETs $Q_{M1}, Q_{M2}, \ldots$ which are memory elements. The MOSFETs $Q_{S1}, Q_{S2}, \ldots$ as the switching elements have the ordinary MOSFET structure consisting of a gate oxide film ($SiO_2$ film) 37 and a gate 38 of polycrystalline silicon formed thereon. The gate electrodes of the MOSFETs $Q_{S1}, Q_{S2}, \ldots$ construct the word lines $W_{S1}, W_{S2}, \ldots$. The FETs $Q_{M1}, Q_{M2}, \ldots$ as the memory elements have the nonvolatile memory device structure shown in FIG. 4. In the gate electrodes of the FETs $Q_{M1}, Q_{M2}, \ldots$, the control gates construct the word lines $W_{M1}, W_{M2}, \ldots$. The two sorts of FETs $Q_{S1}, Q_{S2}, \ldots$ and $Q_{M1}, Q_{M2}, \ldots$ use the N+-type regions 35 existing therebetween, as the common source or drain regions. Each memory cell is constructed in such a way that one pair of FETs $Q_{S1}$ and $Q_{M1}$, $Q_{S2}$ and $Q_{M2}$, ... are connected in series. The adjacent switching elements and adjacent memory elements constituting the different memory cells share the N+-type regions 34 and 36, respectively. An Al wiring lead 47 is connected to the shared N+-type regions 34 and 36 through contact holes. As illustrated in FIG. 6, the Al wiring lead 47 alternately connects the N+-type regions 34 between the switching elements and the N+-type regions 36 between the memory elements.

The devices formed as described above are connected as shown in FIG. 8. Data lines $\overline{D_1}, \overline{D_2}, \ldots$ which are connected to the drains of the memory elements $Q_{M1}, Q_{M2}, \ldots$ are connected to a writing circuit 50. Data lines $D_1, D_2, \ldots$ which are connected to the sources of the switching elements $Q_{S1}, Q_{S2}, \ldots$ are connected to a Y decoder 51 as well as a reading circuit 52. The word lines $W_{S1}, W_{S2}, \ldots$ connected to the gates of the switching elements, and the word lines $W_{M1}, W_{M2}, \ldots$ connected to the gates of the memory elements are respectively connected to an X decoder 53. In addition, the P-type well 31 which is the semiconductor region for forming the memory cells therein is connected to a well voltage circuit 54, to construct a memory circuit. The circuits 50 to 54 are all constructed in accordance with known principles for such circuits.

One major advantage of using FETs of the present invention in memory cells is that in injecting or emitting charge carriers, a high voltage of, e.g., 20 V as in the prior art is not required. For example, in writing data, namely, in injecting charge carriers, any desired one, e.g., $\overline{D_1}$ among the data lines $\overline{D_1}, \overline{D_2}, \ldots$ is connected to 0 V by the writing circuit 50. The other data lines $\overline{D_2}, \ldots$ are connected to 5 V. Any desired one, e.g., $W_{M1}$ among the word lines $W_{M1}, W_{M2}, \ldots$ is connected to a writing voltage of 5 V by the X decoder. The other word lines $W_{M2}, \ldots$ are connected to 0 V. All the word lines $W_{S1}, W_{S2}, \ldots$ are held at 0 V. The data lines $D_1, D_2, \ldots$ are held at any desired value, e.g., 0 V by the Y decoder. On the other hand, the P-type well 31 under the channel of the FET $Q_{M1}$ has the voltage of 0 V applied thereto by the well voltage circuit 54. As a result, charge carriers are injected into the floating gate of the FET $Q_{M1}$ as described before.

In erasing data, namely, in emitting charge carriers, all the word lines are set at the ground potential of 0 V, whereas the potential of the P-type well 31 is set at an erasing voltage of, e.g., 5 V. Thus, charge carriers in all the memory elements are emitted.

At this time, the word lines $W_{S1}, W_{S2}, \ldots$ are held at 0 V, and all the data lines at any desired potential. When one word line, e.g., $W_{M1}$ among the word lines $W_{M1}, W_{M2}, \ldots$ is set at 0 V and the other word lines $W_{M2}, \ldots$ are connected to 5 V, only data in the memory cells connected to $W_{M1}$ can be erased.

In reading data, the data lines $\overline{D_1}, \overline{D_2}, \ldots$ and the word lines $W_{M1}, W_{M2}, \ldots$ are set at 0 V. Among the word lines $W_{S1}, W_{S2}, \ldots$, any desired one, e.g., $W_{S1}$ is rendered 5 V. Since the charge carriers are trapped in the FET $Q_{M1}$ connected to the selected FET $Q_{S1}$, the threshold voltage of the FET $Q_{M1}$ is higher than 0 V, so that this FET does not turn "on". Therefore, the potential of the data line $D_1$ precharged to a certain voltage, e.g., 5 V connected to the FET $Q_{S1}$ does not change. When no charge carriers are trapped in the FET $Q_{M1}$, this FET $Q_{M1}$ turns "on", so that the potential of the data line $D_1$ becomes approximately 0 V. This potential of the data line $D_1$ is sensed by the reading circuit 52 through the Y decoder 51.

Since the writing voltage and erasing voltage in the memory element MOSFET may be 5 V, the supply voltage, 5 V of the memory circuit can be utilized as it is, and a booster circuit is not required. Moreover, since the reading current is sufficiently large, no amplifier circuit is necessary. In addition, since the whole device is flattened and is enhanced in the density of integration, a memory device of large capacity can be constructed.

The memory device and memory circuit described above are merely one example of application of the present invention. Needless to say, other various applications including, for example, a non-volatile random access memory (NVRAM) are possible.

In the nonvolatile memory of the present invention, a gate insulator film under a floating gate is made a double-layer structure by the use of insulator films having dielectric constants different from each other, and the thickness of the upper-layer insulator film is set at or below a predetermined thickness so as to situate a charge centroid within the floating gate. Thus, enhancing the density of integration of a device and lowering a writing voltage and an erasing voltage can be simultaneously achieved while good data retention is maintained. Another effect is that, with an increase in the capacity of the device, the simplification of a memory circuit arrangement can be realized.

Although the present invention has been described with regard to particular illustrated devices, it is to be understood that some advantages of the present invention will be provided to other types of devices by using the gate insulator film or a tunnel region of the present invention in place of the tunnel region of such devices. In other words, it is advantageous in such cases to use the tunnel region of double-layer structure which consists of the silicon dioxide film and the silicon nitride film formed thereon. The tunnel region of the invention can be used, for example, instead of a tunnel dioxide film in a floating gate type nonvolatile memory shown in *Electronics*, Feb. 28, 1980, pp. 113–117, or in a floating gate type cell similar to a one transistor cell shown in *Electronics*, July 31, 1980, pp. 89–92. These cases do not enjoy the advantage of self-alignment found in the embodiments discussed previously, but they do possess other advantages found in the present invention. The invention also applies to other floating gate type nonvolatile memory cell which use tunneling.

It is to be understood that the above-described arrangements are simply illustrative of the application of the principles of this invention. Numerous other arrangements may be readily devised by those skilled in the art which embody the principles of the invention and fall within its spirit and scope.

We claim:

1. A nonvolatile memory having a field effect transistor for use as a memory element, said field effect transistor comprising:
   (a) a semiconductor body which includes at least one first semiconductor region of a first conductivity type;
   (b) an insulator film which is formed on an area of said first semiconductor region, and which is comprised of a first insulator film and a second insulator film formed thereon, wherein said first insulator film is silicon dioxide film and said second insulator film is silicon nitride film;
   (c) a first gate electrode which is formed on said insulator film;
   (d) a second gate electrode which is formed over said first gate electrode;
   (e) an inter-layer insulator film which is disposed between said first and second gate electrodes, wherein said inter-layer insulator film is comprised of a silicon nitride film of a first inter-layer insulator film and a silicon dioxide film of a second inter-layer insulator film formed thereon; and
   (f) semiconductor regions of a second conductivity type which are formed within the first semiconductor region, and which are disposed on opposite sides of said area of said first semiconductor region over which said first and second electrodes are formed, wherein said first inter-layer insulator film and said second insulator film have substantially equal thickness, while said second inter-layer insulator film and said first insulator film have substantially equal thickness.

2. A nonvolatile memory according to claim 1, wherein said silicon dioxide film of said first insulator film is 15–50 Å thick, and said silicon nitride film of said second insulator film is 40–110 Å thick.

3. A nonvolatile memory according to claim 2, wherein said silicon dioxide film of said first insulator film is 20 Å thick, and said silicon nitride film of said second insulator film is 60 Å thick.

4. A nonvolatile memory having a field effect transistor for use as a memory element, said field effect transistor comprising:
   (a) a semiconductor body which includes at least one first semiconductor region of a first conductivity type;
   (b) an insulator film which is formed on an area of said first semiconductor region, and which is comprised of a first insulator film and a second insulator film formed thereon, wherein said first insulator fim is silicon dioxide film and said second insulator film is silicon nitride film;
   (c) a first gate electrode which is formed on said insulator film;
   (d) a second gate electrode which is formed over said first gate electrode;
   (e) an inter-layer insulator film which is disposed between said first and second gate electrodes, wherein said inter-layer insulator film is comprised of a silicon nitride film which is a first inter-layer insulator film, a silicon dioxide film which is a second inter-layer insulator film formed on said first inter-layer insulator film, and a silicon dioxide film which is a third inter-layer insulator film formed between said first gate electrode and said silicon nitride film of said first inter-layer insulator film; and
   (f) semiconductor regions of a second conductivity type which are formed within the first semiconductor region, and which are disposed on opposite sides of said area of said first semiconductor region over which said first and second electrodes are formed.

5. A nonvolatile memory according to claim 4, wherein said silicon dioxide film of said first insulator film is 15–50 Å thick, and said silicon nitride film of said second insulator film is 40–110 Å thick.

6. A nonvolatile memory according to claim 5, wherein said silicon dioxide film of said first insulator film is 20 Å thick, and said silicon nitride film of said second insulator film is 60 Å thick.

7. A nonvolatile memory according to claim 4, wherein said silicon dioxide film of said first insulator film and said silicon dioxide film of said second inter-layer insulator film have substantially equal thicknesses, while said silicon nitride film of said second insulator film and said silicon nitride film of said first inter-layer insulator film have substantially equal thicknesses.

8. A nonvolatile memory having a field effect transistor for use as a memory element, said field effect transistor comprising:
   (a) a semiconductor body which includes at least one first semiconductor region of a first conductivity type;
   (b) a gate insulator film which is formed on an area of said first semiconductor region, and which is comprised of a first insulator film and a second insulator film formed thereon, wherein said first insulator film is silicon dioxide film and said second insulator film is silicon nitride film;
   (c) a floating gate electrode which is formed on said gate insulator film;
   (d) a control gate electrode which is formed over said floating gate electrode;
   (e) an inter-layer insulator film which is disposed between said floating gate and said control gate electrodes, wherein said inter-layer insulator film is comprised of a silicon nitride film of a first inter-layer insulator film and a silicon dioxide film of a second inter-layer insulator film formed thereon; and (f) semiconductor regions of a second conductivity type which are formed within the first semiconductor region, and which are disposed on opposite sides of said area of said first semiconductor region over which said floating gate and said gate electrodes are formed, wherein said first inter-layer insulator film and said second insulator film have substantially equal thickness, while said second inter-layer insulator film and said first insulator film have substantially equal thickness.

9. A nonvolatile memory according to claim 8, wherein said silicon dioxide film of said first insulator film is 15–50 Å thick, and said silicon nitride film of said second insulator film is 40–110 Å thick.

10. A nonvolatile memory according to claim 9, wherein said silicon dioxide film of said first insulator film is 20 Å thick, and said silicon nitride film of said second insulator film is 60 Å thick.

11. A nonvolatile memory having a field effect transistor for use as a memory element, said field effect transistor comprising:

(a) a semiconductor body which includes at least one first semiconductor region of a first conductivity type;

(b) a gate insulator film which is formed on an area of said first semiconductor region, and which is comprised of a first insulator film and a second insulator film formed thereon, wherein said first insulator film is silicon dioxide film and said second insulator film is silicon nitride film;

(c) a floating gate electrode which is formed on said gate insulator film;

(d) a control gate electrode which is formed over said floating gate electrode;

(e) an inter-layer insulator film which is disposed between said floating gate and said control gate electrodes, wherein said inter-layer insulator film is comprised of a silicon nitride film which is a first inter-layer insulator film, a silicon dioxide film which is a second inter-layer insulator film formed on said first inter-layer insulator film, and a silicon dioxide film which is a third inter-layer insulator film formed between said floating gate electrode and said silicon nitride of said first inter-layer insulator film; and (f) semiconductor regions of a second conductivity type which are formed within the first semiconductor region, and which are disposed on opposite sides of said area of said first semiconductor region over which said floating gate and said gate electrodes are formed.

12. A nonvolatile memory according to claim 11, wherein said silicon dioxide film of said first insulator film is 15–50 Å thick, and said silicon nitride film of said second insulator film is 40–110 Å thick.

13. A nonvolatile memory according to claim 12, wherein said silicon dioxide film of said first insulator film is 20 Å thick, and said silicon nitride film of said second insulator film is 60 Å thick.

14. A nonvolatile memory according to claim 11, wherein said silicon dioxide film of said first insulator film and said silicon dioxide film of said second inter-layer insulator film have substantially equal thicknesses, while said silicon nitride film of said second insulator film and said silicon nitride film of said first inter-layer insulator film have substantially equal thicknesses.

* * * * *